United States Patent
Hioka (10) Patent No.: US 10,403,374 B2
(45) Date of Patent: *Sep. 3, 2019

(54) REDUCTION OF OUTPUT VOLTAGE RIPPLE IN BOOSTER CIRCUIT

(71) Applicant: TOSHIBA MEMORY CORPORATION, Tokyo (JP)

(72) Inventor: Takeshi Hioka, Machida Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/131,770

(22) Filed: Sep. 14, 2018

(65) Prior Publication Data

US 2019/0027226 A1 Jan. 24, 2019

Related U.S. Application Data

(63) Continuation of application No. 15/804,355, filed on Nov. 6, 2017, now Pat. No. 10,079,066, which is a
(Continued)

(30) Foreign Application Priority Data

Jun. 29, 2016 (JP) .................................. 2016-128774

(51) Int. Cl.
*G11C 5/04* (2006.01)
*G11C 16/30* (2006.01)
(Continued)

(52) U.S. Cl.
CPC ............ *G11C 16/30* (2013.01); *G11C 7/1063* (2013.01); *G11C 16/04* (2013.01);
(Continued)

(58) Field of Classification Search
CPC ......... G11C 16/30; G11C 16/04; G11C 16/32; G11C 16/08; G11C 16/28
(Continued)

(56) References Cited

U.S. PATENT DOCUMENTS 5,420,505 A * 5/1995 Kondo ............... G01R 31/2884
324/119
5,856,918 A 1/1999 Soneda et al.
(Continued)

FOREIGN PATENT DOCUMENTS

| JP | H09294367 A | 11/1997 |
| JP | 2008130104 A | 6/2008 |
| JP | 2012099177 A | 5/2012 |

*Primary Examiner* — Gene N Auduong
(74) *Attorney, Agent, or Firm* — Kim & Stewart LLP (57) ABSTRACT

A booster circuit includes a charge pump circuit and a clock processing circuit. The clock processing circuit includes a first transistor of a first conductivity type, a second transistor of a second conductivity type, and a third transistor of a third conductivity type. The first and second transistors are connected in series between a high-voltage node and a low-voltage node, and gates of the first and second transistors are connected to each other. The third transistor is connected in parallel with the first transistor between the high-voltage node and an output terminal of the clock processing circuit that is connected to a node between the first transistor and the second transistor and to the charge pump circuit.

21 Claims, 7 Drawing Sheets

Related U.S. Application Data continuation of application No. 15/412,221, filed on Jan. 23, 2017, now Pat. No. 9,859,012.

(51) Int. Cl.
*G11C 16/04* (2006.01)
*G11C 16/32* (2006.01)
*H02M 3/07* (2006.01)
*G11C 7/10* (2006.01)
*G11C 16/08* (2006.01)
*G11C 16/26* (2006.01)

(52) U.S. Cl.
CPC .......... *G11C 16/0483* (2013.01); *G11C 16/32* (2013.01); *H02M 3/07* (2013.01); *H02M 3/073* (2013.01); *G11C 16/08* (2013.01); *G11C 16/26* (2013.01)

(58) Field of Classification Search
USPC ....... 365/189.09, 189.11, 226; 327/536, 537, 327/540
See application file for complete search history.

(56) References Cited

U.S. PATENT DOCUMENTS

| | | | |
|---|---|---|---|
| 5,967,523 | A | 10/1999 | Brownlee |
| 6,215,332 | B1* | 4/2001 | Atsumi .................. G11C 5/143 327/63 |
| 6,980,045 | B1 | 12/2005 | Liu |
| 7,439,795 | B2* | 10/2008 | Yanagigawa .......... G11C 5/145 327/536 |
| 7,551,507 | B2 | 6/2009 | Nakai et al. |
| 7,885,509 | B2 | 2/2011 | Isozaki et al. |
| 8,487,589 | B2 | 7/2013 | Bohme et al. |
| 8,755,235 | B2 | 6/2014 | Midorikawa et al. |
| 9,225,240 | B2 | 12/2015 | Hung et al. |
| 9,859,012 | B1 | 1/2018 | Hioka |
| 2001/0045569 | A1 | 11/2001 | Imamiya |
| 2002/0140499 | A1 | 10/2002 | Okutsu et al. |
| 2004/0136440 | A1 | 7/2004 | Miyata et al. |
| 2007/0085599 | A1 | 4/2007 | Imamiya |
| 2007/0257652 | A1* | 11/2007 | Yanagishima .......... H02M 1/32 323/284 |

\* cited by examiner

REDUCTION OF OUTPUT VOLTAGE RIPPLE IN BOOSTER CIRCUIT

CROSS-REFERENCE TO RELATED APPLICATIONS

This application is a continuation of U.S. patent application Ser. No. 15/804,355, filed on Nov. 6, 2017, which is a continuation of U.S. patent application Ser. No. 15/412,221, filed on Jan. 23, 2017, now U.S. Pat. No. 9,859,012, issued on Jan. 2, 2018, which is based upon and claims the benefit of priority from Japanese Patent Application No. 2016-128774, filed Jun. 29, 2016, the entire contents of each of which are incorporated herein by reference.

FIELD

Embodiments described herein relate generally to a booster circuit.

BACKGROUND

A booster circuit boosts a voltage by using charging and discharging of a capacitor responsive to a clock signal. In a NAND flash memory, the boosted voltage is used as, for example, a write voltage, a read voltage, or an erase voltage.

DETAILED DESCRIPTION

An embodiment provides a booster circuit capable of reducing ripples of an output voltage in a wide range while preventing any increase in circuit area thereof.

In general, according to an embodiment, a booster circuit includes a charge pump circuit and a clock processing circuit. The charge pump circuit includes a plurality of transistors connected in series in each of which a gate and a channel electrode is connected, and a plurality of capacitors each of which is connected to the channel electrode of a corresponding one of the transistors. The clock processing circuit includes a first transistor of a first conductivity type, a second transistor of a second conductivity type, and a third transistor of a third conductivity type. The first and second transistors are connected in series between a high-voltage node and a low-voltage node, and gates of the first and second transistors are connected to each other. The third transistor is connected in parallel with the first transistor between the high-voltage node and an output terminal of the clock processing circuit that is connected to a node between the first transistor and the second transistor and to at least one of the capacitors of the charge pump circuit.

Hereinafter, embodiments will be described with reference to the drawings. In the drawings, the same elements are assigned same reference characters.

<Embodiment>

A booster circuit according to an embodiment is described below with reference to FIGS. 1 to 10. In the following description, it is assumed that the booster circuit is used for a semiconductor memory device (NAND flash memory), but this is not limited. Furthermore, in the following description, the term "connected" refers to not only direct connection but also connection via any element. Moreover, one end of a transistor represents one of a source and a drain thereof, and the other end of the transistor represents the other of the source and the drain.

[Configuration Example of Embodiment]

Figure 1:
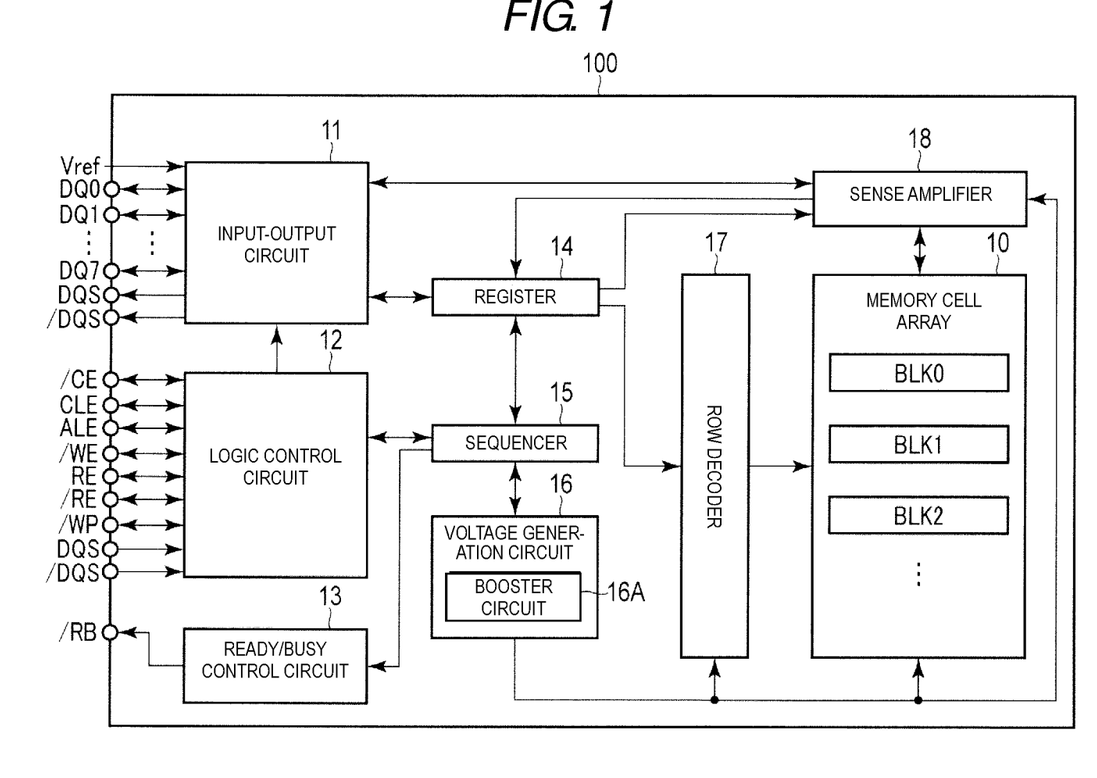
FIG. 1 is a block diagram of a semiconductor memory device including a booster circuit according to an embodiment.
Figure 2:
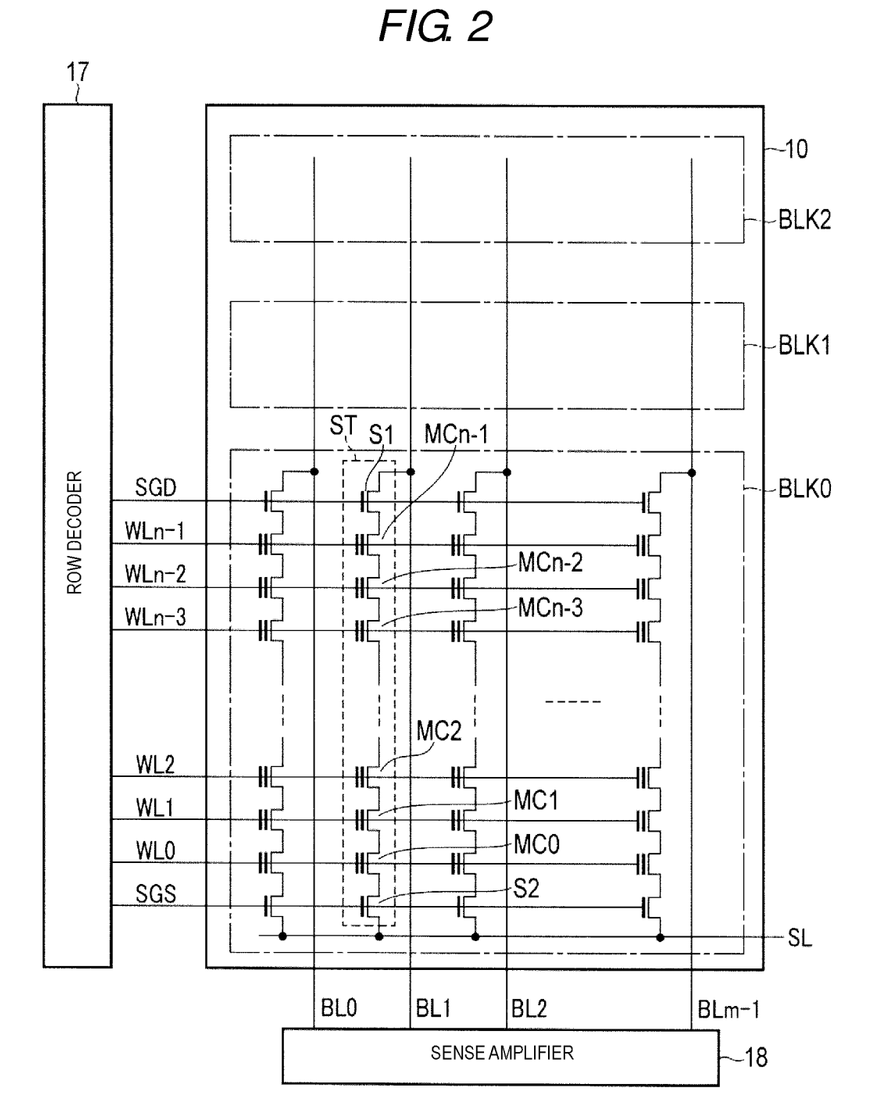
FIG. 2 schematically illustrates a memory cell array in the semiconductor memory device including the booster circuit according to the embodiment.

FIG. 1 illustrates a semiconductor memory device 100 including a booster circuit 16A according to the embodiment. FIG. 2 illustrates a memory cell array 10 in the semiconductor memory device 100 including the booster circuit 16A according to the embodiment.

As illustrated in FIG. 1, the semiconductor memory device 100 includes the memory cell array 10, an input-output circuit 11, a logic control circuit 12, a ready/busy control circuit 13, a register 14, a sequencer 15, a voltage generation circuit 16, a row decoder 17, and a sense amplifier 18.

The memory cell array 10 includes a plurality of blocks BLK (BLK0, BLK1, ... ). More specifically, as illustrated in FIG. 2, the block BLK0 includes a plurality of NAND strings ST. Further, each NAND string ST includes, for example, n (n being an integer equal to or greater than 2) memory cell transistors MC (MC0 to MCn−1) and selection transistors S1 and S2.

The memory cell transistor MC (hereinafter sometimes referred to simply as the "memory cell MC") includes a stacked gate, which includes a control gate and a charge storage layer, and stores data in a non-volatile manner. The memory cell transistors MC0 to MCn−1 are connected in series, and have a current pathway through the serial connection. One end of the memory cell transistor MCn−1, which is located at one end of the serial connection, is connected to one end of the selection transistor S1, and one end of the memory cell transistor MC0, which is located at the other end of the serial connection, is connected to one end of the selection transistor S2.

The gates of a plurality of selection transistors S1 of the NAND strings in a block are connected in common to a select gate line SGD. On the other hand, the gates of a plurality of selection transistors S2 of the NAND strings in the block are connected in common to a select gate line SGS. Moreover, the gates of a plurality of memory cell transistors MC0 to a plurality of memory cell transistors MCn−1 in the block are connected in common to word lines WL0 to WLn−1, respectively.

Furthermore, the other ends of respective selection transistors S1 of NAND strings ST located in the same column (arranged side by side of different blocks BLK) among the NAND strings ST arrayed in a matrix state in the memory cell array 10 are connected in common to one of the bit lines BL (BL0 to BLm−1, m being an integer equal to or greater than 2). Moreover, the other ends of respective selection transistors S2 are connected in common to a source line SL. That is, the source line SL is used in common, for example, in a plurality of blocks BLK.

Data stored in the memory cell transistors MC of the same block BLK can be collectively erased. On the other hand, reading and writing of data are collectively performed with respect to a plurality of memory cell transistors MC connected in common to a same word line WL of a same block BLK. This data unit is referred to as "page".

Since the structure of each of the Blocks BLK1, BLK2, . . . is similar to that of the block BLK0, the description thereof is omitted.

As illustrated in FIG. 1, the input-output circuit 11 sends and receives signals DQ (DQ0 to DQ7) to and from an external device (for example, a controller) connected to the semiconductor memory device 100. The signals DQ include, for example, a command, an address, and data. The input-output circuit 11 transfers a command and an address received from the external device to the register 14. The input-output circuit 11 transfers write data received from the external device to the sense amplifier 18, and transfers read data from the sense amplifier 18 to the external device. Furthermore, the input-output circuit 11 receives a voltage Vref from the external device. The voltage Vref is a reference voltage for the other voltages in various operations. Moreover, the input-output circuit 11 sends data strobe signals DQS and /DQS together with the read data to the external device. The read data is read out in synchronization with the signals DQS and /DQS.

The logic control circuit 12 receives various control signals from the external device to control the input-output circuit 11 and the sequencer 15. The control signals used for such control include, for example, a chip enable signal /CE, a command latch enable signal CLE, an address latch enable signal ALE, a write enable signal /WE, read enable signals RE and /RE, and a write protect signal /WP. The signal /CE is used to enable the semiconductor memory device 100. The signals CLE and ALE are used to notify the input-output circuit 11 that the signals DQ are a command and an address, respectively. The signal /WE is used to instruct the input-output circuit 11 to input the signals DQ. The signals RE and /RE are used to instruct the input-output circuit 11 to output the signals DQ. The signals /WP is used to bring the semiconductor memory device 100 into a write-protected state at the time of, for example, power-on and power-off. Moreover, the logic control circuit 12 receives the signals DQS and /DQS together with the write data. The write data is written in synchronization with the signals DQS and /DQS.

The ready/busy control circuit 13 transfers a signal /RB to the external device to notify the external device of the state of the semiconductor memory device 100. The signal /RB indicates whether the semiconductor memory device 100 is in a ready state (a state of accepting an instruction from the external device) or in a busy state (a state of not accepting an instruction from the external device).

The register 14 retains the command and the address. The register 14 transfers the address to the row decoder 17 and the sense amplifier 18, and also transfers the command to the sequencer 15. Moreover, the register 14 retains various tables used to control a sequence that is executed based on the command.

The sequencer 15 receives the command and refers to the various tables retained in the register 14. Then, the sequencer 15 controls the entire semiconductor memory device 100 according to information indicated in the various tables.

The voltage generation circuit 16 generates voltages required for operations such as writing, reading, and erasing of data under the control of the sequencer 15. The voltage generation circuit 16 supplies the generated voltages to the row decoder 17 and the sense amplifier 18. The voltage generation circuit 16 includes the booster circuit 16A. The booster circuit 16A boosts a voltage, and the boosted voltage is used for the operations such as writing, reading, and erasing. Details of the booster circuit 16A are described below with reference to FIG. 3.

The row decoder 17 receives a row address from the register 14, and selects a word line WL in the memory cell array 10 based on the row address. Then, the row decoder 17 supplies the voltage from the voltage generation circuit 16 to the selected word line WL.

The sense amplifier 18 reads data stored in the memory cell MC via the bit line BL of the memory cell array 10, or writes data into the memory cell MC of the memory cell array 10 via the bit line BL. The sense amplifier 18 includes a data latch (not illustrated), and the data latch temporarily stores write data and read data. The sense amplifier 18 receives a column address from the register 14, and outputs the data stored in the data latch to the input-output circuit 11 based on the column address.

Figure 3:
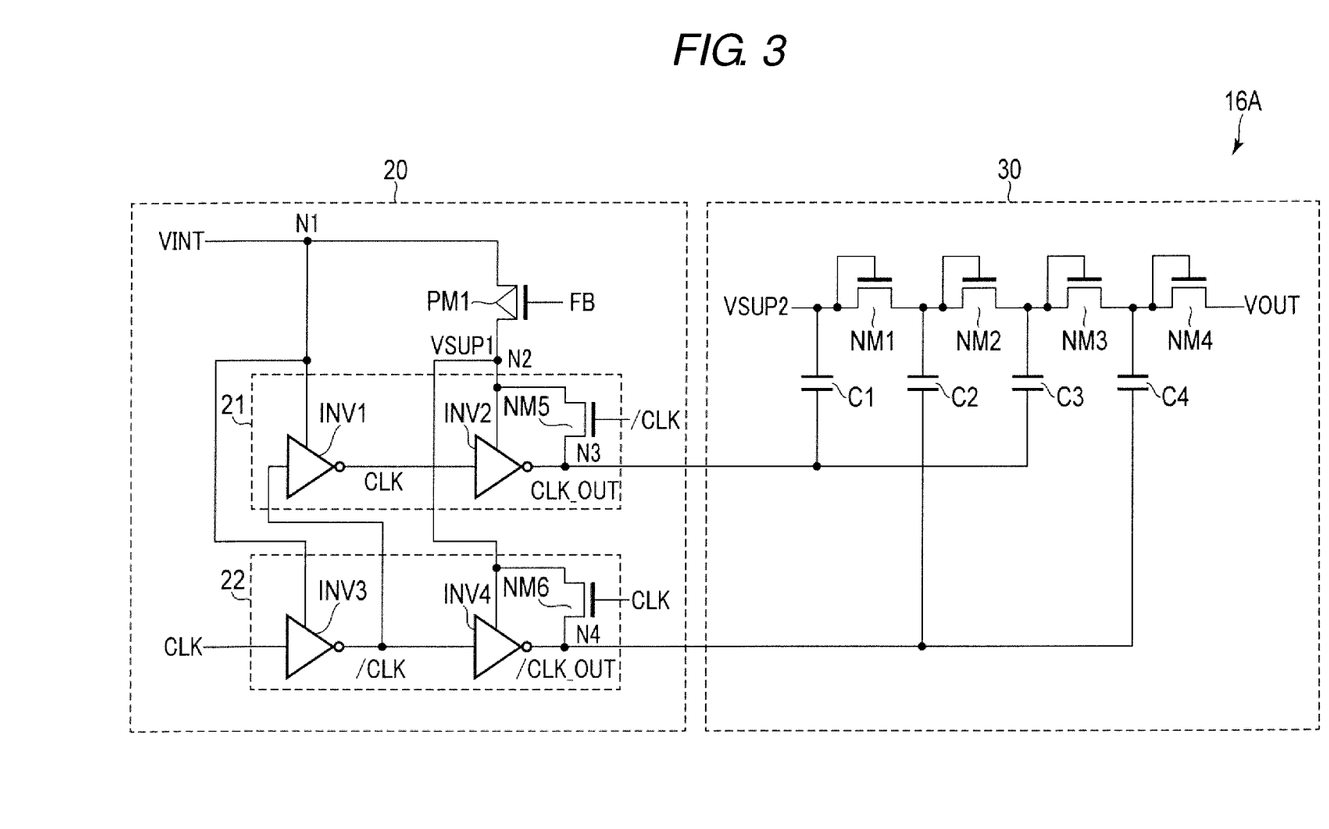
FIG. 3 is a circuit diagram of the booster circuit according to the embodiment.

FIG. 3 illustrates the booster circuit 16A according to the embodiment.

As illustrated in FIG. 3, the booster circuit 16A includes a clock generation circuit 20 and a charge pump 30.

The charge pump 30 includes NMOS transistors NM1 to NM4 and capacitors C1 to C4. Here, the numbers of NMOS transistors and capacitors in the charge pump 30 are not limited to four.

Each of the NMOS transistors NM1 to NM4 is diode-connected and, thus, functions as a diode. The NMOS transistors NM1 to NM4 are connected in series and have a current pathway through the serial connection.

One ends of the capacitors C1 to C4 are connected to one ends of the NMOS transistors NM1 to NM4, respectively. A clock signal CLK_OUT is supplied to the other end of each of the capacitors C1 and C3, and a clock signal /CLK_OUT is supplied to the other end of each of the capacitors C2 and C4.

A voltage VSUP2 (for example, a power-supply voltage VDD) is supplied (input) to one end of the NMOS transistor NM1. The capacitors C1 to C4 repeat charging and discharging according to the clock signals CLK_OUT and /CLK_OUT. As a result, an output voltage VOUT higher than the voltage VSUP2 is generated, and the output voltage VOUT is output from the other end of the NMOS transistor NM4.

The clock generation circuit 20 includes a first clock signal generation circuit 21, a second clock signal generation circuit 22, and a PMOS transistor PM1. In the first clock signal generation circuit 21, a clock signal /CLK is input and the clock signal CLK_OUT is output. In the second clock signal generation circuit 22, a clock signal CLK is input and the clock signal /CLK_OUT is output. Here, the clock signal /CLK is an inversion signal of the clock signal CLK, and the clock signal /CLK_OUT is an inversion signal of the clock signal CLK_OUT.

The first clock signal generation circuit 21 includes inverters INV1 and INV2 and an NMOS transistor NM5.

An input terminal of the inverter INV1 is electrically connected to an output terminal of an inverter INV3, and the clock signal /CLK is supplied to the input terminal of the inverter INV1. Furthermore, a power terminal of the inverter INV1 is electrically connected to a node N1, and a voltage VINT (for example, a power-supply voltage VDD) is supplied to the power terminal of the inverter INV1. The clock signal CLK is output from an output terminal of the inverter INV1.

An input terminal of the inverter INV2 is electrically connected to the output terminal of the inverter INV1, and the clock signal CLK is supplied to the input terminal of the inverter INV2. Furthermore, a power terminal of the inverter INV2 is electrically connected to a node N2, and a voltage VSUP1 is supplied to the power terminal of the inverter INV2. An output terminal of the inverter INV2 is electrically connected to a node N3, and the clock signal CLK_OUT is output to the node N3.

One end of the NMOS transistor NM5 is electrically connected to the node N2, the other end thereof is electrically connected to the node N3, and the clock signal /CLK is supplied to the gate thereof.

The second clock signal generation circuit 22 includes inverters INV3 and INV4 and an NMOS transistor NM6.

The clock signal CLK is supplied to an input terminal of the inverter INV3. Moreover, a power terminal of the inverter INV3 is electrically connected to the node N1, and the voltage VINT is supplied to the power terminal of the inverter INV3. The clock signal /CLK is output from an output terminal of the inverter INV3.

An input terminal of the inverter INV4 is electrically connected to the output terminal of the inverter INV3, and the clock signal /CLK is supplied to the input terminal of the inverter INV4. Moreover, a power terminal of the inverter INV4 is electrically connected to the node N2, and the voltage VSUP1 is supplied to the power terminal of the inverter INV4. An output terminal of the inverter INV4 is electrically connected to a node N4, and the clock signal /CLK_OUT is output to the node N4.

One end of the NMOS transistor NM6 is electrically connected to the node N2, the other end thereof is connected to the node N4, and the clock signal CLK is supplied to the gate thereof.

One end of the PMOS transistor PM1 is electrically connected to the node N1, and the voltage VINT is supplied to one end of the PMOS transistor PM1. A signal FB is supplied to the gate of the PMOS transistor PM1. The signal FB is a signal based on the output voltage VOUT. More specifically, when the output voltage VOUT is small, a low voltage, for example, a voltage VSS, is supplied as the signal FB. Thus, a voltage nearly equal to the voltage VINT is applied to the node N1. On the other hand, when the voltage VOUT is close to a predetermined voltage (voltage Vset), a higher voltage is applied as the signal FB. Thus, a voltage lower than the voltage VINT is applied to the node N1.

Figure 4:
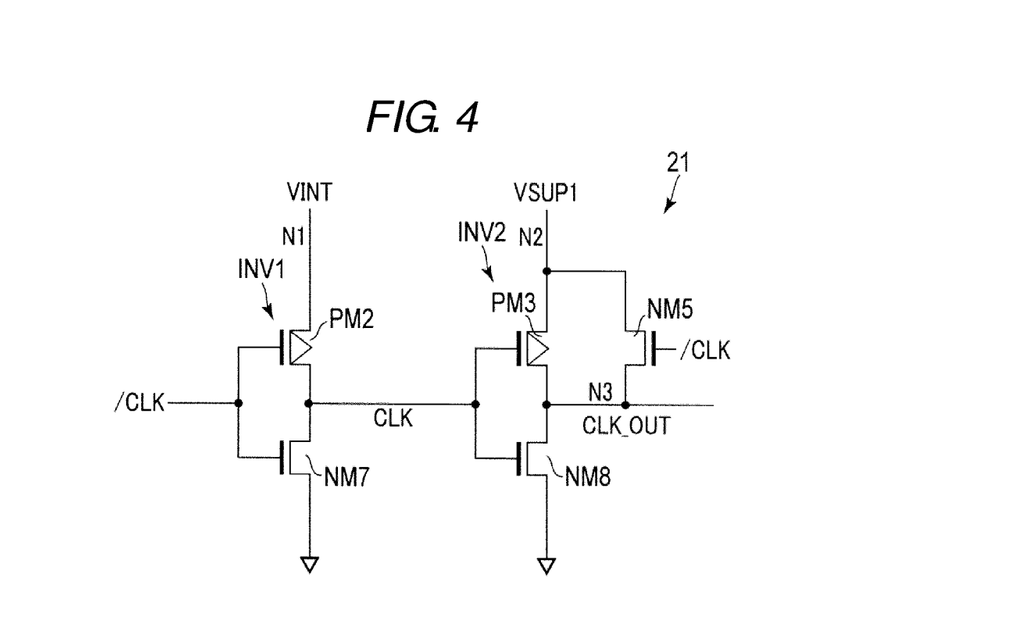
FIG. 4 is a circuit diagram of a first clock signal generation circuit in the booster circuit according to the embodiment.
Figure 5:
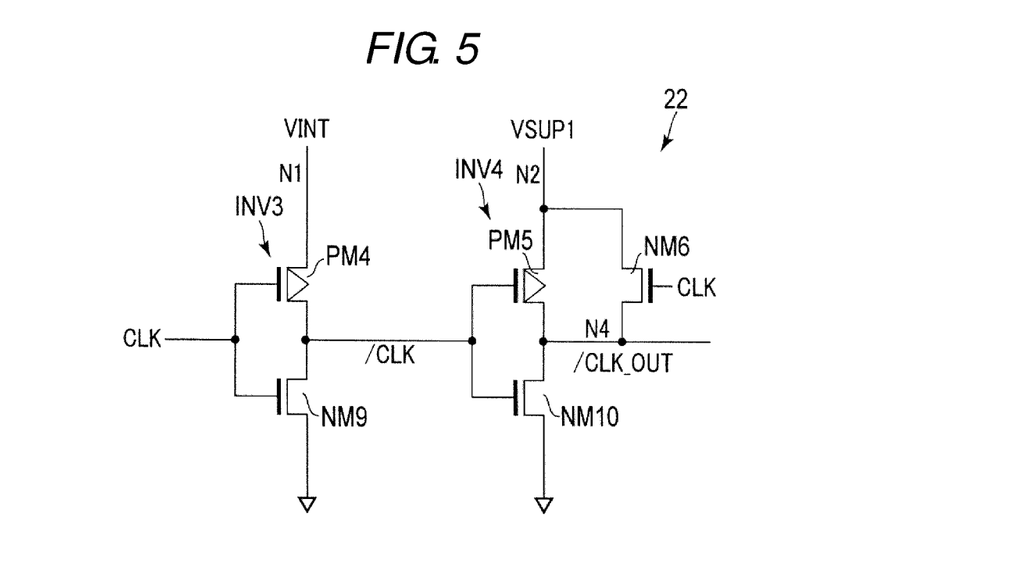
FIG. 5 is a circuit diagram of a second clock signal generation circuit in the booster circuit according to the embodiment.

FIG. 4 is a circuit diagram illustrating the first clock signal generation circuit 21 in the booster circuit 16A according to the present embodiment. FIG. 5 is a circuit diagram illustrating the second clock signal generation circuit 22 in the booster circuit 16A according to the present embodiment.

As illustrated in FIG. 4, the inverter INV1 in the first clock signal generation circuit 21 includes a PMOS transistor PM2 and an NMOS transistor NM7.

One end of the PMOS transistor PM2 is the power terminal of the inverter INV1, and the voltage VINT is applied to said one end of the PMOS transistor PM2. The other end of the PMOS transistor PM2 is electrically connected to one end of the NMOS transistor NM7. The other end of the NMOS transistor NM7 is a ground terminal of the inverter INV1, and ground voltage VSS is applied to the other end of the NMOS transistor NM7. The gate of the PMOS transistor PM2 is electrically connected to the gate of the NMOS transistor NM7.

The gate of the PMOS transistor PM2 and the gate of the NMOS transistor NM7 serve as the input terminal of the inverter INV1, and the clock signal /CLK is supplied to the gate of the PMOS transistor PM2 and the gate of the NMOS transistor NM7. Moreover, the other end of the PMOS transistor PM2 and said one end of the NMOS transistor NM7 serve as the output terminal of the inverter INV1, and the clock signal CLK is output from the other end of the PMOS transistor PM2 and said one end of the NMOS transistor NM7.

The inverter INV2 in the first clock signal generation circuit 21 includes a PMOS transistor PM3 and an NMOS transistor NM8.

One end of the PMOS transistor PM3 is the power terminal of the inverter INV2, and the voltage VSUP1 is applied to said one end of the PMOS transistor PM3. The other end of the PMOS transistor PM3 is electrically connected to one end of the NMOS transistor NM8. The other end of the NMOS transistor NM8 is a ground terminal of the inverter INV2, and the ground voltage VSS is applied to the other end of the NMOS transistor NM8. The gate of the PMOS transistor PM3 is electrically connected to the gate of the NMOS transistor NM8 and the output terminal of the inverter INV1. One end of the NMOS transistor NM5 is electrically connected to said one end of the PMOS transistor PM3, and the other end of the NMOS transistor NM5 is electrically connected to the other end of the PMOS transistor PM3. The clock signal /CLK is supplied to the gate of the NMOS transistor NM5.

The gate of the PMOS transistor PM3 and the gate of the NMOS transistor NM8 serve as the input terminal of the inverter INV2, and the clock signal CLK is supplied to the gate of the PMOS transistor PM3 and the gate of the NMOS transistor NM8. Moreover, the other end of the PMOS transistor PM3, said one end of the NMOS transistor NM8, and the other end of the NMOS transistor NM5 serve as the output terminal of the inverter INV2, and the clock signal CLK_OUT is output from the other end of the PMOS transistor PM3, said one end of the NMOS transistor NM8, and the other end of the NMOS transistor NM5.

As illustrated in FIG. 5, the inverter INV3 in the second clock signal generation circuit 22 includes a PMOS transistor PM4 and an NMOS transistor NM9.

One end of the PMOS transistor PM4 is the power terminal of the inverter INV3, and the voltage VINT is applied to said one end of the PMOS transistor PM4. The other end of the PMOS transistor PM4 is electrically connected to one end of the NMOS transistor NM9. The other end of the NMOS transistor NM9 is a ground terminal of the inverter INV3, and the ground voltage VSS is applied to the other end of the NMOS transistor NM9. The gate of the PMOS transistor PM4 is electrically connected to the gate of the NMOS transistor NM9.

The gate of the PMOS transistor PM4 and the gate of the NMOS transistor NM9 serve as the input terminal of the inverter INV3, and the clock signal CLK is supplied to the gate of the PMOS transistor PM4 and the gate of the NMOS transistor NM9. Moreover, the other end of the PMOS transistor PM4 and said one end of the NMOS transistor NM9 serve as the output terminal of the inverter INV3, and the clock signal /CLK is output from the other end of the PMOS transistor PM4 and said one end of the NMOS transistor NM9.

The inverter INV4 in the second clock signal generation circuit 22 includes a PMOS transistor PM5 and an NMOS transistor NM10.

One end of the PMOS transistor PM5 is the power terminal of the inverter INV4, and the voltage VSUP1 is applied to said one end of the PMOS transistor PM5. The other end of the PMOS transistor PM5 is electrically connected to one end of the NMOS transistor NM10. The other end of the NMOS transistor NM10 is a ground terminal of the inverter INV4, and the ground voltage VSS is applied to the other end of the NMOS transistor NM10. The gate of the PMOS transistor PM5 is electrically connected to the gate of the NMOS transistor NM10 and the output terminal of the inverter INV3. One end of the NMOS transistor NM6 is electrically connected to said one end of the PMOS transistor PM5, and the other end of the NMOS transistor NM6 is electrically connected to the other end of the PMOS transistor PM5. The clock signal CLK is supplied to the gate of the NMOS transistor NM6.

The gate of the PMOS transistor PM5 and the gate of the NMOS transistor NM10 serve as the input terminal of the inverter INV4, and the clock signal /CLK is supplied to the PMOS transistor PM5 and the gate of the NMOS transistor NM10. Moreover, the other end of the PMOS transistor PM5, said one end of the NMOS transistor NM10, and the other end of the NMOS transistor NM6 serve as the output terminal of the inverter INV4, and the clock signal /CLK_OUT is output from the other end of the PMOS transistor PM5, said one end of the NMOS transistor NM10, and the other end of the NMOS transistor NM6.

[Operation Example of Embodiment]

Figure 6:
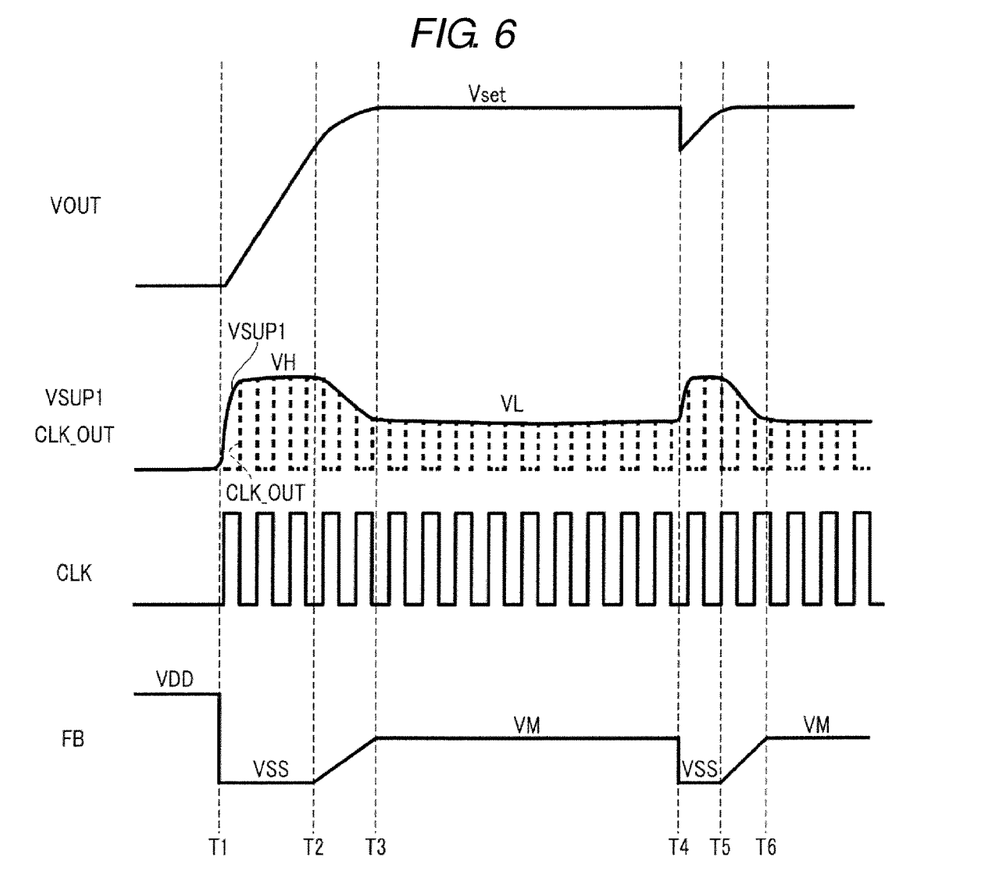
FIG. 6 is a timing chart illustrating operations carried out by the booster circuit according to the embodiment.

FIG. 6 is a timing chart illustrating operations carried out by the booster circuit 16A according to the preset embodiment. FIG. 6 illustrates voltage levels of the output voltage VOUT, the voltage VSUP1, the signals CLK_OUT, CLK, and FB. The booster circuit 16A increases the boosting capability for the output voltage VOUT by raising the signal CLK_OUT, and decreases the boosting capability for the output voltage VOUT by lowering the signal CLK_OUT. The signal CLK_OUT is determined and regulated according to the voltage VSUP1. Details of the operations are described below.

First, an example of boosting the output voltage VOUT during times T1 to T3 is described.

As illustrated in FIG. 6, the voltage VSUP1 rises up to a voltage VH at time T1. The voltage VSUP1 is adjusted by increasing a voltage which the PMOS transistor PM1 illustrated in FIG. 3 is able to output according to the signal FB, which is based on the level of the output voltage VOUT. The voltage VH is output to the gate of the PMOS transistor PM1 according to the voltage VSS being supplied as the signal FB, and is thus the voltage VINT (for example, a power-supply voltage VDD supplied from an external device to the semiconductor memory device 100). Voltage output of the PMOS transistor PM1 is controlled according to the signal FB, which is supplied to the gate of the PMOS transistor PM1. The signal FB is fed back in an analog manner by, for example, dividing the output voltage VOUT with resistors and detecting a result of voltage division. At this time, the PMOS transistor PM3 illustrated in FIG. 4 is turned on in synchronization with the "L (low)" level of the clock signal CLK. With this, the PMOS transistor PM3 outputs a voltage equal to the voltage VSUP1 (voltage VH) from the node N2 to the node N3. That is, the clock signal CLK_OUT rises up to the voltage VH in synchronization with the "L" level of the clock signal CLK. The output voltage VOUT is boosted by the clock signal CLK_OUT.

Next, at time T2, when the output voltage VOUT is boosted up to a value close to a desired voltage Vset, the voltage of the signal FB applied to the gate of the PMOS transistor PM1 increases. With this, the voltage which the PMOS transistor PM1 is able to output decreases and the voltage VSUP1 decreases. Then, the clock signal CLK_OUT decreases to a voltage equal to the voltage VSUP1 in synchronization with the "L" level of the clock signal CLK. As a result, the boosting speed of the output voltage VOUT decreases.

Next, at time T3, when the output voltage VOUT is boosted up to the desired voltage Vset, a voltage VM is applied as the signal FB to the gate of the PMOS transistor PM1 (VSS<VM<VDD). Then, the PMOS transistor PM1 outputs a voltage VL (<VH), so that the voltage VSUP1 becomes the voltage VL. Then, the clock signal CLK_OUT becomes the same voltage as the voltage VSUP1 (voltage VL) in synchronization with the "L" level of the clock signal CLK. As a result, the output voltage VOUT is kept to the voltage Vset. Thus, the boosting level obtained by the voltage VL matches a load used to output the voltage Vset.

Next, an example of re-boosting the output voltage VOUT when the output voltage VOUT decreases due to a load, such as noise, at time T4 and subsequent times is described.

When, at time T4, the output voltage VOUT decreases due to a load, such as noise, the decrease of the output voltage VOUT is detected. Then, the voltage VSS is applied as the signal FB to the gate of the PMOS transistor PM1. As a result, the PMOS transistor PM1 outputs the voltage VH, so that the voltage VSUP1 rises up to the voltage VH. As a result, the clock signal CLK_OUT rises up to the voltage VH in synchronization with the "L" level of the clock signal CLK, so that the output voltage VOUT is boosted. Here, the voltage VSUP1 may not rise up to the voltage VH, and varies between the voltage VL and the voltage VH.

Next, when, at time T5, the output voltage VOUT is boosted up to a voltage close to the desired voltage Vset, the voltage of the signal FB applied to the gate of the PMOS transistor PM1 increases. As a result, the voltage which the PMOS transistor PM1 is able to output decreases, so that the voltage VSUP1 lowers. Then, the clock signal CLK_OUT decreases to a voltage equal to the voltage VSUP1 in synchronization with the "L" level of the clock signal CLK. As a result, the boosting speed of the output voltage VOUT decreases.

Then, when, at time T6, the output voltage VOUT is boosted up to the desired voltage Vset, the voltage VM is applied as the signal FB to the gate of the PMOS transistor PM1. As a result, the PMOS transistor PM1 outputs the voltage VL, so that the voltage VSUP1 becomes the voltage VL. Then, the clock signal CLK_OUT has a voltage equal to the voltage VSUP1 (voltage VL) in synchronization with the "L" level of the clock signal CLK. As a result, the output voltage VOUT is kept to the voltage Vset.

Furthermore, while the clock signals CLK and CLK_OUT (FIG. 4) are described with reference to FIG. 6, the clock signals /CLK and /CLK_OUT (FIG. 5), which are inversion signals thereof, can be described in a similar way to the above description.

Figure 7:
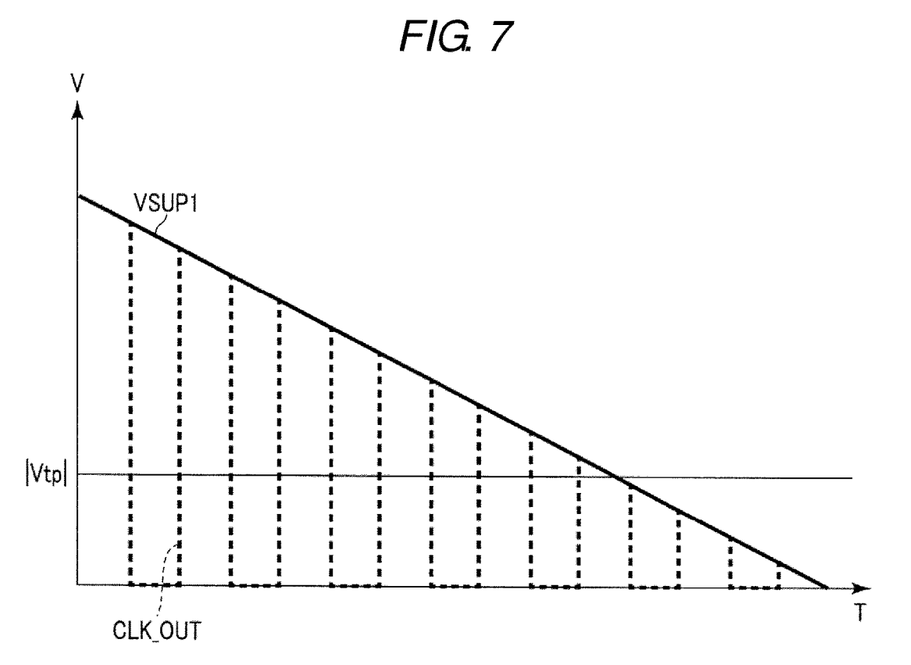
FIG. 7 illustrates levels of a clock signal in a case where a voltage VSUP1 decreases with time in the booster circuit according to the embodiment.
Figure 8:
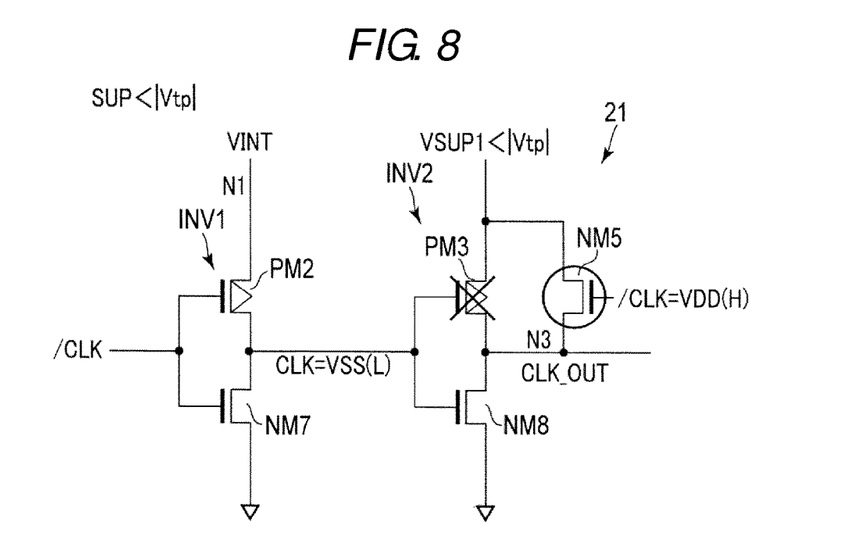
FIG. 8 is a circuit diagram of the first clock signal generation circuit to explain a circuit operation in a case where the absolute value of the voltage VSUP1 illustrated in FIG. 7 is less than the absolute value of a threshold voltage.

FIG. 7 illustrates levels of the clock signal CLK_OUT in a case where the voltage VSUP1 decreases with time in the booster circuit 16A according to the embodiment. FIG. 8 is a circuit diagram of the first clock signal generation circuit 21 to explain a circuit operation in a case where the absolute value of the voltage VSUP1 illustrated in FIG. 7 is less than the absolute value of a threshold voltage Vtp. Here, the threshold voltage Vtp is a threshold voltage for the PMOS transistor PM3.

As illustrated in FIG. 7, in a case where a voltage equal to or higher than the absolute value of the threshold voltage Vtp is applied as the voltage VSUP1 to the node N2, the absolute value of a gate-source voltage Vgs (VSS−VSUP1) of the PMOS transistor PM3 becomes equal to or greater than the absolute value of the threshold voltage Vtp when the clock signal CLK is at the "L" level. As a result, the PMOS transistor PM3 enters an on-state and outputs the voltage VSUP1 of the node N2. As a result, the signal CLK_OUT at a voltage equal to the voltage VSUP1 is output to the node N3.

Furthermore, at this time, the NMOS transistor NM5 enters an on-state in synchronization with the "H (high)" level of the clock signal /CLK (voltage VDD) (in synchronization with the "L" level of the clock signal CLK). As a result, as with the PMOS transistor PM3, the NMOS transistor NM5 outputs the voltage VSUP1 of the node N2, and outputs the signal CLK_OUT at a voltage equal to the voltage VSUP1 to the node N3.

On the other hand, as illustrated in FIGS. 7 and 8, in a case where a voltage lower than the absolute value of the threshold voltage Vtp is applied as the voltage VSUP1 to the node N2, the PMOS transistor PM3 is turned off even if the clock signal CLK is at the "L" level. This is because the absolute value of a gate-source voltage Vgs (VSS−VSUP1) of the PMOS transistor PM3 is less than the absolute value of the threshold voltage Vtp.

However, in a case where a voltage lower than the absolute value of the threshold voltage Vtp is applied as the voltage VSUP1 to the node N2, the NMOS transistor NM5 is turned on in synchronization with the "H" level of the clock signal /CLK (in synchronization with the "L" level of the clock signal CLK). This is because the absolute value of a gate-source voltage Vgs (VDD−CLK_OUT) of the NMOS transistor NM5 is set to be equal to or higher than the absolute value of the voltage Vtn (the threshold voltage of the NMOS transistor NM5). As a result, the NMOS transistor NM5 outputs the voltage VSUP1 of the node N2, and outputs the signal CLK_OUT at a voltage equal to the voltage VSUP1 to the node N3.

Furthermore, while the first clock signal generation circuit 21 is described with reference to FIGS. 7 and 8, the second clock signal generation circuit 22 can also be described in a similar way to the above description. More specifically, the second clock signal generation circuit 22 includes the NMOS transistor NM6. For that reason, in a case where the voltage VSUP1 has become lower than the absolute value of the threshold voltage Vtp of the PMOS transistor PM5, the voltage VSUP1 of the node N2 is output from the NMOS transistor NM6. Thus, the signal /CLK_OUT at a voltage equal to the voltage VSUP1 is output to the node N4.

[Advantageous Effect of Embodiment]

Ordinarily, noise (ripple) is included in a voltage generated and output by a booster circuit due to the influence of a clock signal. This ripple of the output voltage may affect, for example, write/readout characteristics and a leak detection operation.

A method for reducing ripples includes one employing an RC filter for an output voltage. However, in a case where an RC filter is used, as ripples of a longer period (at a lower frequency) occur, the resistor and capacitor in the RC filter need to be made larger. Actually, while the output voltage is output at tens of MHz (high frequency) during a boosting operation, the output voltage is output at several MHz (low frequency) during a stable operation. Since ripples occur at several MHz (low frequency, in other words, long period) when the output voltage is stable, the area of the RC filter needs to be made larger.

Figure 9:
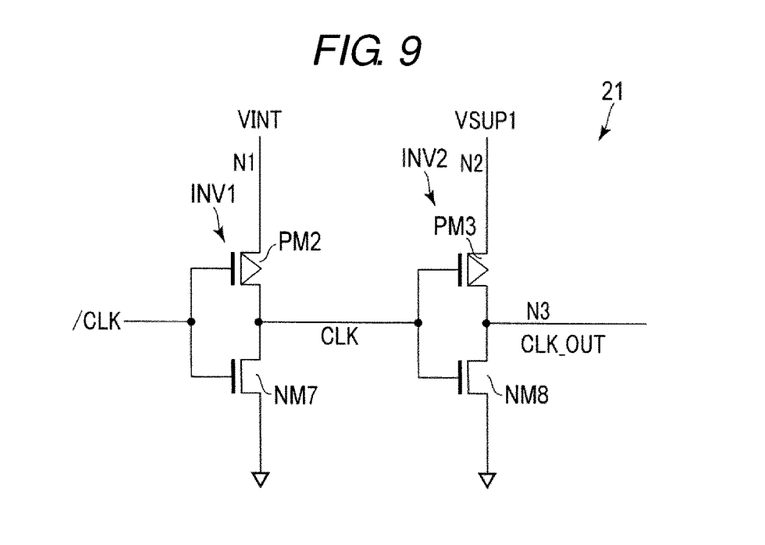
FIG. 9 is a circuit diagram of a first clock signal generation circuit in a booster circuit according to a comparative example.

As illustrated in FIG. 9, a booster circuit according to a comparative example, unlike the present embodiment, does not include the NMOS transistor NM5 in the first clock signal generation circuit 21 (and the NMOS transistor NM6 in the second clock signal generation circuit 22). In the booster circuit according to the comparative example, the voltage VSUP1 is set to be lower to decrease the amplitude (voltage level) of the clock signal CLK_OUT (/CLK_OUT). The period of the output voltage VOUT depends on the amplitude of the clock signal CLK_OUT (/CLK_OUT). For that reason, decreasing the amplitude of the clock signal CLK_OUT (/CLK_OUT) enables shortening the period of the output voltage VOUT. Thus, the period of ripples of the output voltage VOUT is also shortened. As a result, any increase of the area of the RC filter can be prevented, and, thus, the circuit area can be prevented from increasing. Moreover, decreasing the amplitude of the clock signal CLK_OUT (/CLK_OUT) results in a decrease in amplitude of the output voltage VOUT and in amplitude itself of ripples of the output voltage. As a result, the RC filter would be unnecessary.

Figure 10:
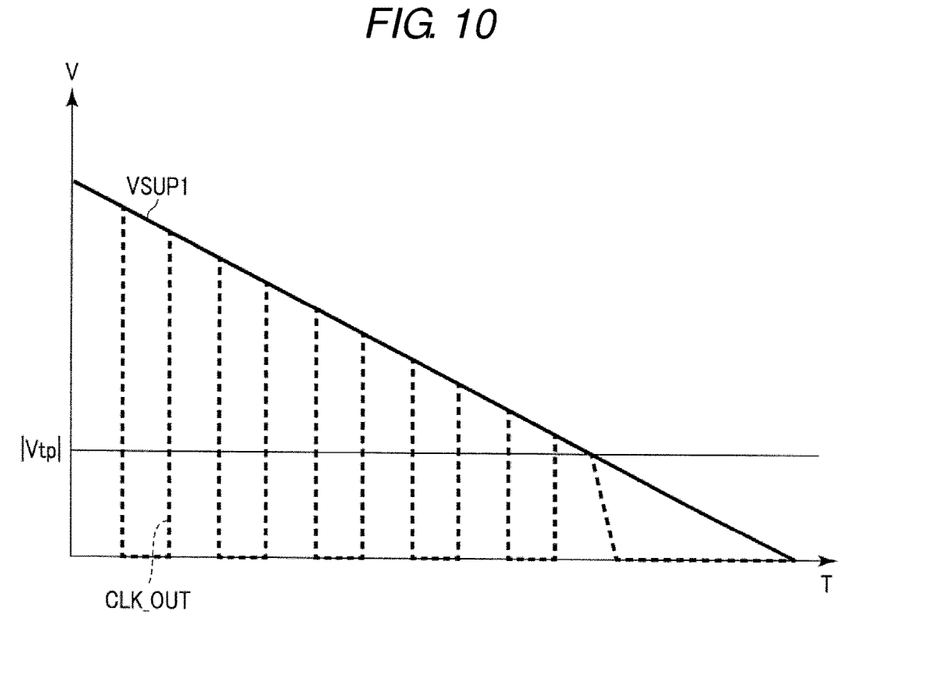
FIG. 10 illustrates levels of a clock signal CLK_OUT in a case where a voltage VSUP1 decreases with time in the booster circuit according to the comparative example.

However, in the comparative example, in a case where a wide range of output voltage VOUT is necessary, the following problem arises. In a case where the output voltage VOUT is small, to reduce ripples while maintaining the output voltage VOUT, it is necessary to set the voltage of the clock signal CLK_OUT (/CLK_OUT), i.e., the voltage VSUP1, to be smaller. In the comparative example, if the voltage VSUP1 is set to be too small, the inverter INV2 cannot function normally. More specifically, as illustrated in FIG. 10, when the voltage VSUP1 is smaller than the absolute value of the threshold voltage Vtp of the PMOS transistor PM3, the PMOS transistor PM3 would be turned off. Therefore, the voltage VSUP1 of the node N2 is not output, and the voltage of the signal CLK_OUT at the node N3 may decrease. Similarly, the inverter INV4 does not function normally, and the voltage of the signal /CLK_OUT at the node N4 may decrease. As a result, it is not possible to perform boosting by the charge pump, and it is not possible to reduce ripples while maintaining a desired voltage VOUT.

On the other hand, according to the present embodiment, the NMOS transistor NM5 is provided in the first clock signal generation circuit 21. For that reason, even in a case where the voltage VSUP1 is smaller than the absolute value of the threshold voltage Vtp of the PMOS transistor PM3, the voltage VSUP1 of the node N2 can be output from the NMOS transistor NM5. Thus, the signal CLK_OUT at a voltage equal to the voltage VSUP1 is output to the node N3.

Similarly, the NMOS transistor NM6 is provided in the second clock signal generation circuit 22. For that reason, even in a case where the voltage VSUP1 is smaller than the absolute value of the threshold voltage Vtp of the PMOS transistor PM5, the voltage VSUP1 of the node N2 can be output from the NMOS transistor NM6. Thus, the signal /CLK_OUT at a voltage equal to the voltage VSUP1 is output to the node N4.

Therefore, according to the present embodiment, even in the case of a wide range of output voltage VOUT (in particular, a small output voltage VOUT), it is possible to reduce ripples while maintaining a desired voltage VOUT.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A booster circuit comprising:
    a charge pump circuit including
        a plurality of transistors connected in series, and
        a plurality of capacitors, one end of each of the capacitors being connected to an anode electrode of a corresponding one of the transistors; and
    a clock processing circuit including
        a first transistor of a first conductivity type that is connected between a first node and a second node,
        a second transistor of a second conductivity type that is connected between the second node and a third node and that has a gate connected to a gate of the first transistor, and
        a third transistor of the second conductivity type connected between the first node and the second node, the second node being connected to the charge pump circuit.

2. The booster circuit according to claim 1, wherein a first clock signal is input to the gates of the first and second transistors, and a second clock signal is input to a gate of the third transistor, a logical level of the second clock signal being opposite to a logical level of the first clock signal.

3. The booster circuit according to claim 2, wherein when the first node is at a voltage level not sufficient to turn on the first transistor, the third transistor is turned on.

4. The booster circuit according to claim 1, wherein the clock processing circuit further includes a fourth transistor of the first conductivity type that is connected between a fourth node and the first node, a feedback signal corresponding to an output voltage of the charge pump circuit being applied to a gate of the fourth transistor.

5. The booster circuit according to claim 4, wherein the clock processing circuit further includes
    a fifth transistor of the first conductivity type that is connected between the first node and a fifth node,
    a sixth transistor of the second conductivity type that is connected between the fifth node and the third node and that has a gate connected to a gate of the fifth transistor, and
    a seventh transistor of the second conductivity type connected between the first node and the fifth node, the fifth node being connected to the charge pump circuit at a different position than the second node.

6. The booster circuit according to claim 5, wherein a first clock signal is input to gates of the first, second, and seventh transistors, and a second clock signal is input to gates of the third, fifth, and sixth transistors, a logical level of the second clock signal being opposite to a logical level of the first clock signal.

7. The booster circuit according to claim 5, wherein the clock processing circuit further includes
    a first inverter having an output terminal that is connected to the gates of the first and second transistors, and
    a second inverter having an output terminal that is connected to the gates of the fifth and sixth transistors and to an input terminal of the first inverter.

8. The booster circuit according to claim 5, wherein a first power supply voltage is applied to the fifth node, and a second power supply voltage is applied to the third node, the first power supply voltage being higher than the second power supply voltage.

9. The booster circuit according to claim 1, wherein the first conductivity type is P type, and the second conductivity type is N type.

10. The booster circuit according to claim 1, wherein each of the transistors of the charge pump circuit includes a transistor of the second conductivity type having a gate and two ends, the gate being connected to one of the two ends and functioning as the anode.

11. A semiconductor device comprising:
    an operation circuit configured to perform operation; and
    a booster circuit configured to generate voltages used for the operation, wherein the booster circuit includes:
        a charge pump circuit including
            a plurality of transistors connected in series, and
            a plurality of capacitors, one end of each of the capacitors being connected to an anode electrode of a corresponding one of the transistors; and
        a clock processing circuit including
            a first transistor of a first conductivity type that is connected between a first node and a second node,
            a second transistor of a second conductivity type that is connected between the second node and a third node and that has a gate connected to a gate of the first transistor, and
            a third transistor of the second conductivity type connected between the first node and the second node, the second node being connected to the charge pump circuit.

12. The semiconductor device according to claim 11, wherein a first clock signal is input to the gates of the first and second transistors, and a second clock signal is input to a gate of the third transistor, a logical level of the second clock signal being opposite to a logical level of the first clock signal.

13. The semiconductor device according to claim 12, wherein when the first node is at a voltage level not sufficient to turn on the first transistor, the third transistor is turned on.

14. The semiconductor device according to claim 11, wherein the clock processing circuit further includes a fourth transistor of the first conductivity type that is connected between a fourth node and the first node, a feedback signal corresponding to an output voltage of the charge pump circuit being applied to a gate of the fourth transistor.

15. The semiconductor device according to claim 14, wherein the clock processing circuit further includes
    a fifth transistor of the first conductivity type that is connected between the first node and a fifth node,
    a sixth transistor of the second conductivity type that is connected between the fifth node and the third node and that has a gate connected to a gate of the fifth transistor, and a seventh transistor of the second conductivity type connected between the first node and the fifth node, the fifth node being connected to the charge pump circuit at a different position than the second node.

16. The semiconductor device according to claim 15, wherein a first clock signal is input to gates of the first, second, and seventh transistors, and a second clock signal is input to gates of the third, fifth, and sixth transistors, a logical level of the second clock signal being opposite to a logical level of the first clock signal.

17. The semiconductor device according to claim 15, wherein the clock processing circuit further includes
a first inverter having an output terminal that is connected to the gates of the first and second transistors, and
a second inverter having an output terminal that is connected to the gates of the fifth and sixth transistors and to an input terminal of the first inverter.

18. The semiconductor device according to claim 15, wherein a first power supply voltage is applied to the fifth node, and a second power supply voltage is applied to the third node, the first power supply voltage being higher than the second power supply voltage.

19. The semiconductor device according to claim 11, wherein the first conductivity type is P type, and the second conductivity type is N type.

20. The semiconductor device according to claim 11, wherein each of the transistors of the charge pump circuit includes a transistor of the second conductivity type having a gate and two ends, the gate being connected to one of the two ends and functioning as the anode.

21. The semiconductor device according to claim 11, wherein the operation circuit includes a semiconductor memory cell array having a plurality of memory cell transistors.

* * * * *